(12) United States Patent
Kato (10) Patent No.: US 7,474,413 B2
(45) Date of Patent: Jan. 6, 2009

(54) METHOD AND APPARATUS FOR ANALYZING INTERFERENCE FRINGE

(75) Inventor: Seima Kato, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 50 days.

(21) Appl. No.: 11/364,600

(22) Filed: Feb. 27, 2006

(65) Prior Publication Data

US 2006/0203253 A1     Sep. 14, 2006

(30) Foreign Application Priority Data

Feb. 28, 2005  (JP) ............... 2005-053445

(51) Int. Cl.
*G01B 9/02* (2006.01)
(52) U.S. Cl. .................... 356/521; 356/520
(58) Field of Classification Search ............. 356/450, 356/515, 520, 521
See application file for complete search history.

(56) References Cited

U.S. PATENT DOCUMENTS

| | | | | |
|---|---|---|---|---|
| 5,191,200 A | * | 3/1993 | van der Werf et al. ..... | 250/201.4 |
| 5,835,217 A | | 11/1998 | Medecki | |
| 6,312,373 B1 | | 11/2001 | Ichihara | |
| 2005/0007602 A1 | * | 1/2005 | Haidner et al. ............. | 356/521 |
| 2006/0044569 A1 | * | 3/2006 | Kato ............................. | 356/515 |

FOREIGN PATENT DOCUMENTS

| | | |
|---|---|---|
| JP | 57-64139 | 4/1982 |
| JP | 2000-97666 | 4/2000 |

OTHER PUBLICATIONS

Optical Shop Testing. Edited by Daniel Malacara, Chapter 8, "Foucaut, Wire, and Phase Modulation Tests", J. Ojeda-Castaneda, p. 231-281, John Wiley and Sons, 1978.
Optical Shop Testing. 2nd Edition, Edited by Daniel Malacara, Chapter 13, "Interferogram Evaluation and Wavefront Fitting", D. Malacara and S. L. DeVore, pp. 455-499, John Wiley and Sons, 1992.

* cited by examiner

*Primary Examiner*—Michael A Lyons
(74) *Attorney, Agent, or Firm*—Morgan & Finnegan, L.L.P.

(57) ABSTRACT

Disclosed is a method of analyzing an interference fringe, with which method the optical characteristics of an optical system to be examined can be analyzed very precisely. In one preferred form of the invention, the analyzing method includes a step of detecting information related to a first interference fringe produced by interference of two light fluxes, a step of detecting information related to a second interference fringe produced while changing a phase of one of the two light fluxes by $\pi$ as multiplied by an odd number (e.g., $1\pi, 3\pi, \ldots$), and a step of detecting averaged information of phase information of the two interference fringes, on the basis of the detected information of the first and second interference fringes and by use of Fourier transform.

11 Claims, 9 Drawing Sheets

METHOD AND APPARATUS FOR ANALYZING INTERFERENCE FRINGE

FIELD OF THE INVENTION AND RELATED ART

This invention relates to a method and an apparatus for analyzing interference fringes obtainable with an interferometer.

Interferometers have been used for measurement of optical characteristics of an optical system, more specifically, wavefronts or wavefront aberration of light passed through or reflected by that optical system. The wavefront measurement for optical systems using an interferometer is capable of measuring the wavefront of light passed through or reflected by the optical system to be examined, very accurately. For this reason, it is quite suitable for measurement of optical characteristics of optical systems for which aberrations have to be controlled precisely.

An example of such optical systems is an optical system of a projection type exposure apparatus (hereinafter, "exposure apparatus") used in a lithographic process for manufacture of semiconductor devices or liquid crystal devices, for example. In such exposure apparatuses, it is strictly required that a pattern of a mask (reticle) is accurately transferred to a member to be exposed, at a predetermined magnification. To this end, use of a projection optical system having a good imaging performance and reduced aberrations is very important.

In recent years, miniaturization in size of a pattern to be transferred has been required in order to meet further miniaturization in size of semiconductor devices. In order to achieve this, the aberration of optical systems of an exposure apparatus has to be controlled very precisely. In this respect, it is necessary to measure the wavefront of a projection optical system very accurately.

As regards high-precision measurement of the wavefront of an optical system, there are Point Diffraction Interferometry Method and Lateral Shearing Interferometry Method, for example (see patent documents Nos. 1, 2 and 3 to be mentioned below).

The wavefront measurement based on interferometric methods including the point diffraction interferometry method and the lateral shearing interferometry method, should involve a process for analyzing an interference fringe measured by using an interferometer to detect the wavefront aberration (a phase distribution of the wavefront). In this specification, this process for obtaining the wavefront aberration on the basis of the interference fringe will be referred to as wavefront retrieval or a wavefront retrieving operation. For such wavefront retrieval from the interference fringe, there are a phase shift method and a Fourier transform method based on Fourier transform (including fast Fourier transform).

The wavefront retrieval based on the phase shift method is a method that uses a plurality of interference fringe images as can be observed while changing a phase difference between to light fluxes to be interfered with each other (that is, by shifting the phase). From changes in the intensity of plural interference fringes, initial phases of pixels of a detector that detects the interference fringe are determined. A phase map obtained thereby is converted into a wavelength scale, whereby the wavefront is determined.

On the other hand, the wavefront retrieval based on the Fourier transform method is a method that, while an aberration component of an optical system to be examined, which component is included in the wavefront, has a property of disturbing a carrier fringe of an interference fringe, on the basis of this property the carrier fringe and the aberration component are separated from each other. More specifically, two-dimensional FFT (fast Fourier transform) is carried out to the interference fringe to convert the same into a frequency map. Only a portion of the frequency map adjacent the carrier frequency is chosen, and coordinate conversion is carried out thereto so that the carrier frequency can act as an origin. Thereafter, iFFT (inverse fast Fourier transform) is carried out and phase terms of a complex amplitude map are determined. A phase map obtained thereby shows the wavefront aberration. The Fourier transform method is discussed in a non-paten document No. 1 to be mentioned below.

In accordance with the Fourier transform method, the wavefront can be retrieved from a single interference fringe image. To the contrary, the phase shift method needs observation of plural interference fringe images, of a number of five (5), seven (7), nine (9) or thirteen (13), for example. In this respect, the Fourier transform method has superiority to the phase shift method in terms of measurement time. Furthermore, in the phase shift method, when plural interference fringes are observed, if the light quantity of a light source changes, it causes an error in the measurement result. In the Fourier transform method as compared therewith, since the wavefront is retrieved by analyzing the spatial frequency of the interference image, in principle it is not affected by a change in light quantity. Also in this respect, the Fourier transform method has superiority to the phase shift method.

Patent Document No. 1: Japanese Laid-Open Patent Application, Publication No. SHO57-064139
Patent Document No. 2: U.S. Pat. No. 5,835,217
Patent Document No. 3: Japanese Laid-Open Patent Application, Publication No. 2000-097666 (corresponding to U.S. Pat. No. 6,312,373)
Non-Patent Document No. 1: Daniel Malacara, "Optical Shop Testing", John Wiley & Sons Inc. 231 (1978)

SUMMARY OF THE INVENTION

However, the Fourier transform method involves a problem which is not found in the phase shift method. Generally, a light convergence point of an optical system which is going to be examined has certain extension due to aberrations of that optical system or any other factors. If the skirt (or hem thereof) of such extension reaches another light convergence point being contributable to an interference fringe, it ends in an error factor. In this specification, for convenience, the light at such skirt due to extension of the light convergence point will hereinafter be referred to as "flare of light convergence point". In accordance with the Fourier transform method, the wavefront aberration is detected on the basis of spatial transition of an interference fringe. Therefore, if light other than the light to be detected is mixed as a flare, the position of the interference fringe is displaced and, as a result, an aberration not inherently included may be detected. Details of such flare will be discussed later with reference to preferred embodiments of the present invention.

It is accordingly an object of the present invention to provide an improved method and apparatus for analyzing an interference fringe produced by interference of light.

In accordance with an aspect of the present invention, there is provided a method of analyzing an interference fringe produced by interference of light, said method comprising: a first detecting step for detecting information related to a first interference fringe produced by interference of two light fluxes; a second detecting step for detecting information related to a second interference fringe produced while changing a phase of one of the two light fluxes by $(2n+1)\pi$ (that is, π as multiplied by an odd number); and a third detecting step for detecting averaged information of phase information of the first and second interference fringes, on the basis of the detected information of the first and second interference fringes and by use of Fourier transform.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

First of all, description will be made to the flare which may be a factor of inaccurate measurement (inaccurate calculation) of wavefront aberration in greater detail, while taking a point diffraction grating (PDI) as an example. Prior to that, however, the principle of point diffraction interferometer will be explained below.

Figure 1:
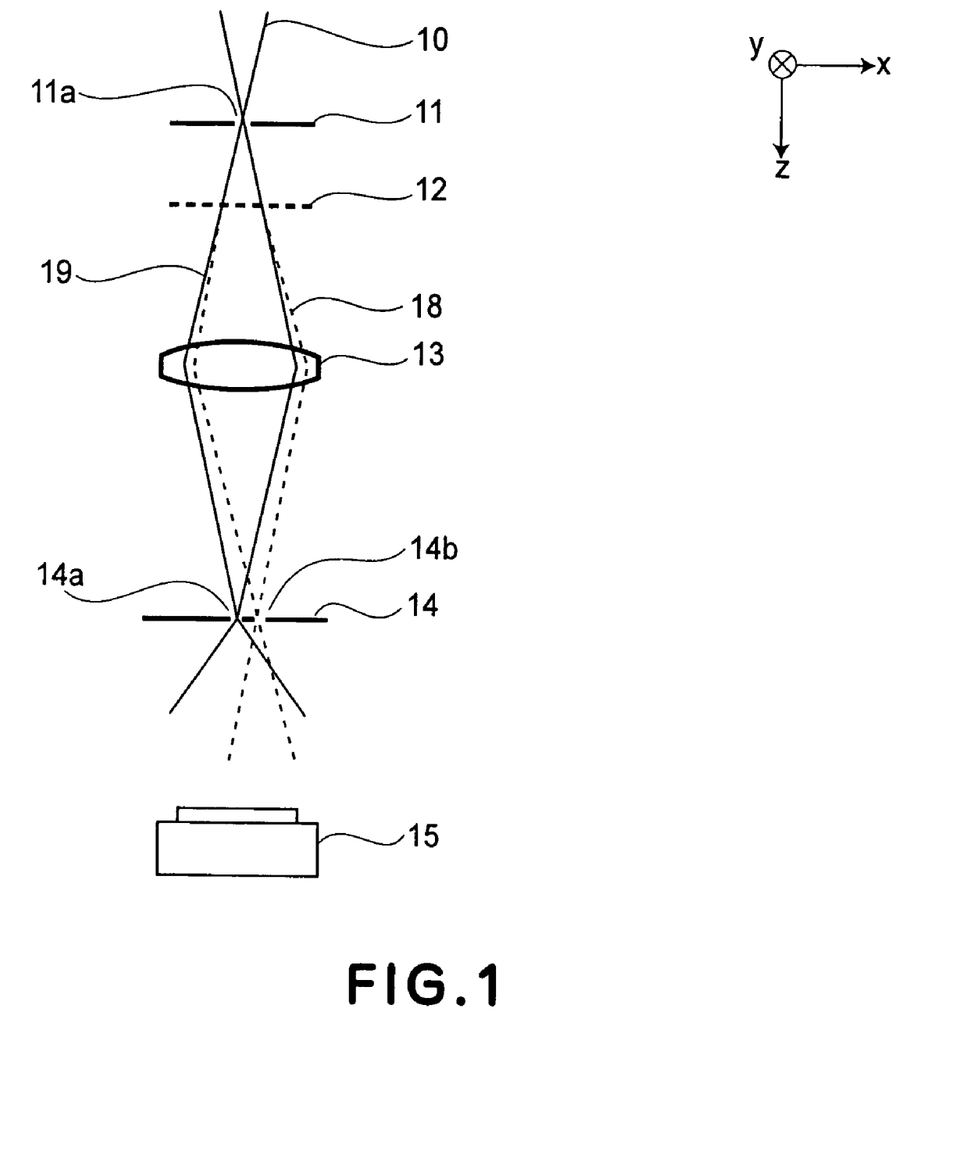
FIG. 1 is a schematic view for explaining the optical arrangement of a PDI (Point Diffraction Interferometer).

FIG. 1 is a schematic view of a point diffraction interferometer. In FIG. 1, denoted at 13 is an optical system for which optical characteristics are going to be examined. A light flux 10 emitted from a light source (not shown) advances through an illumination optical system (not shown), and it illuminates a mask 11 which is disposed on an object plane of the optical system 13 to be examined. The mask 11 is formed with a small pinhole 11a, and the light flux 10 passes through this pinhole 11a and is incident on a diffraction grating 12 after that. The pinhole 11a is made sufficiently small with respect to the wavelength of the light flux 10, such that the light passed therethrough is emitted as an idealistically spherical wave.

The idealistically spherical wave emerging out from the pinhole 11a is divided by the diffraction grating 12 into zeroth-order light 19 (solid line) and first-order light 18 (broken line), and they are incident on the optical system 13 to be examined. The light passed through the optical system 13 is imaged upon an image plane. Here, if the optical system 13 has an aberration, the wavefront of each of the zeroth-order light 19 and the first-order light 18 is deformed in accordance with the aberration, such that they are imaged upon the image plane as a wavefront that bears aberration information.

Figure 2:
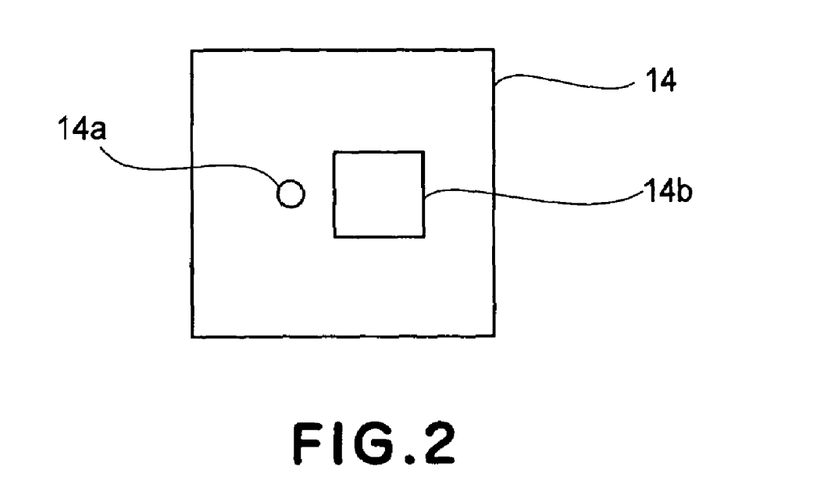
FIG. 2 is an enlarged view of a mask having a pinhole.

Disposed at the image plane is a mask 14 which, as shown in FIG. 2, has a pinhole 14a and a window (opening) 14b. They are disposed so that the zeroth-order light 19 is imaged at the pinhole 14a position and the first-order light 18 is imaged on the window 14b position.

Like the pinhole 11a, the pinhole 14a is made sufficiently small with respect to the wavelength of incident light, and it has a function for emitting light having been incident on the pinhole 14a, as an idealistically spherical wave. On the other hand, the window 14b is made sufficiently large with respect to the incident light, so that the light incident on this window goes out of it substantially without changing the wavefront shape thereof.

Thus, the zeroth-order light 19 passed through the pinhole 14a becomes an idealistically spherical wave again, and it serves as a reference wavefront. On the other hand, the first-order light 18 passed through the window 14b still bears the aberration information about the optical system 13b to be examined and, therefore, it is very the wavefront to be examined.

Both of the zeroth-order light 19 (i.e., reference wavefront) and the first-order light 18 (i.e., wavefront to be examined) are incident on a detector 15, such that an interference fringe of them can be observed upon the detector 15. The detector 15 may comprise a photoelectric converting element such as CCD, for example.

What has been described above is the basic principle of the point diffraction interferometry. From the interference fringe observed through the detector 14, the wavefront can be retrieved in accordance with the Fourier transform method.

Now, the flare in the point diffraction interferometry will be explained.

In the point diffraction interferometry, the zeroth-order light 19 and the first-order light 18 are converged upon the pinhole 14a and the window 14b, respectively, of the image-plane side mask 14. Idealistically, it is desired that only the zeroth-order light 19 passes through the pinhole 14a and that only the first-order light 18 passes through the window 14a.

Figure 3:
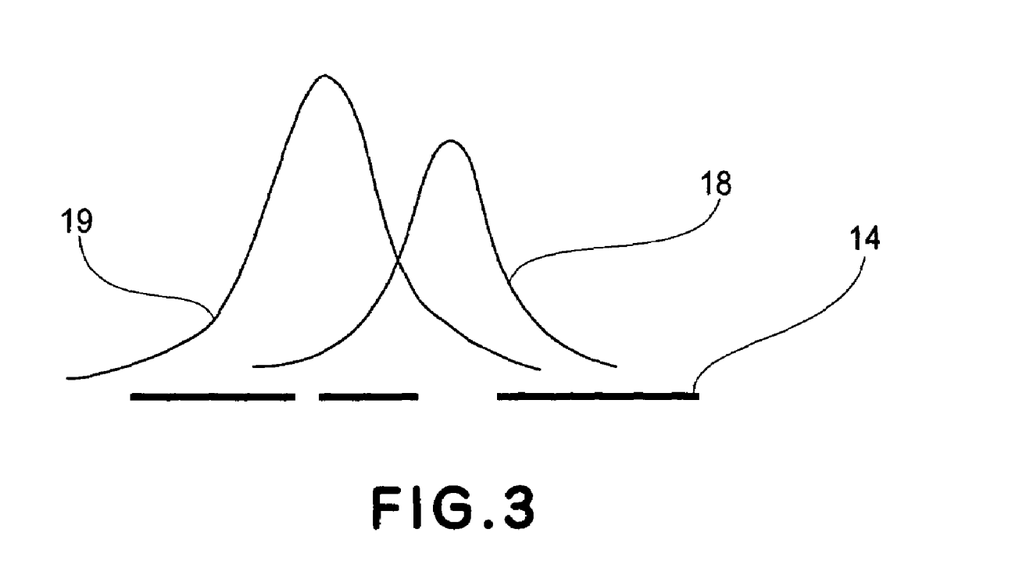
FIG. 3 is a graph showing an intensity distribution of diffraction light, upon the surface of a mask.

Practically, however, there are cases wherein the zeroth-order light passes the window 14a. FIG. 3 shows the intensity distribution of the zeroth-order light 19 and the first-order light 18 upon the mask 14. Here, it should be noted that FIG. 3 illustrates the intensity distribution with exaggeration, for better understanding. Each of the zeroth-order light 19 and the first-order light 18 has a peak adjacent the pinhole 14a or the window 14b, and it has an intensity distribution that extends laterally as a skirt. Specifically, the skirt of the intensity distribution of the zeroth-order light 19 extends over the window 14b. This means that a portion of the zeroth-order light 19 is incident on the window 14b. Since it is idealistically desirable that the zeroth-order light 19 is incident on the pinhole 14a only, incidence of the zeroth-order light on the window 14b is undesirable. Such undesirably incident light is the very flare. As regards the interference fringe which is obtainable in this state, since the light passed through the window 14b provides such wavefront that the flare of the zeroth-order light 19 is being superposed upon the first-order light 18 (i.e., the wavefront to be examined), the interference fringe contains a component of the influence of flare in addition to the aberration information about the optical system to be examined. This means that the position of the interference fringe is changeable between a case without a flare and a case with a flare.

In the wavefront retrieval according to the Fourier transform method, the wavefront is detected from spatial transition of an interference fringe. For this reason, if any light other than the light to be detected (that is, the first-order light 18) is mixed, the position of the interference fringe would be displaced. As a result, the retrieved wavefront would be affected by light other than the light to be detected. Of such unwanted light, the flare resulting from extension of light convergent point having been described above has the most serious influence.

If the wavefront retrieval is carried out on the basis of such interference fringe as described above and in accordance with the Fourier transform method, a resultant wavefront would be one that contains the influence of flare in addition to the aberration of the optical system 13 to be examined. Therefore, it is very difficult to detect the wavefront of the optical system 13 exactly.

What has been described above is the flare and the influence thereof to the interference fringe.

Now, the present invention will be explained.

A few embodiments of the present invention will be described below with reference to a method of reducing the influence of flare in a case where the flare is adversely influential to the interference fringe. More specifically, Embodiment 1 will be described with reference to an example of point diffraction interferometry PDI and in relation to a process of flare influence upon the wavefront and a method of canceling the same. Embodiment 2 will be described with reference to an example wherein, in accordance with a CGLSI (Cross Grating Lateral Shearing Interferometry) process using an orthogonal grating (two-dimensional diffraction grating), two interference fringes are wavefront-retrieved through a Fourier transform method and, after that, they are averaged. Embodiment 3 will be described with reference to an example wherein two interference fringes are averaged at the time moment of the interference fringe by use of a shearing method CGLSI using an orthogonal grating and, after that, the wavefront retrieval is carried out in accordance with the Fourier transform method so that a transmission wavefront of an optical system 13 is detected.

Embodiment 1

The first embodiment of the present invention concerns retrieving the wavefront in the wavefront measurement based on the point diffraction interferometry, while reducing the influence of flare. The interferometer structure used herein is the same as shown in FIG. 1.

If upon the image plane the flare of zeroth-order light, among the light diffracted by the diffraction grating 12 in FIG. 1, extends to the light convergence-point position of the first-order light, a complex amplitude of the flare of the zeroth-order light is added to a complex amplitude of the first-order light. Thus, an accurate phase can not be detectable. Here, the words "accurate phase" means a numerical value corresponding to the phase term of the complex amplitude of the first-order diffraction light. In regard to light transmitted through the window 14b, a composite complex amplitude of the first-order light and the flare can be expressed by equation (1) below.

$$Te^{i\theta} + fe^{i(\theta-\alpha)} \approx Te^{i\left(\theta-\frac{f}{T}\sin\alpha\right)} \quad (1)$$

wherein T is the amplitude of the light to be detected and f is the amplitude of the flare, and wherein f<<T.

In equation (1), α is the phase difference between the first-order light (light to be detected) and the flare, and θ is the phase of the first-order light 18 that corresponds to the transmission wavefront of the optical system 13 to be detected. Any change in phase resulting from the influence of the flare is now denoted by ø. The interference fringe to be detected by the detector 15 is the interference fringe that is produced by interference between the idealistic spherical wave emitted through the pinhole 14a and the light transmitted through the window 14b, corresponding to equation (1) above. If the complex amplitude of the idealistic spherical wave is denoted by S, the interference fringe intensity I to be detected by the detector 15 can be expressed by equation (2) below, and thus the phase change ø (=erroneous detection amount) due to the flare can be detected.

$$I = \left|S + Te^{i\left(\theta-\frac{f}{T}\sin\alpha\right)}\right|^2 \quad (2)$$

$$= |S|^2 + |T|^2 + 2|S||T|\cos\left(\theta - \frac{f}{T}\sin\alpha\right)$$

$$\therefore \varphi = -\frac{f}{T}\sin\alpha[rad.]$$

The light to be detected (i.e., first-order light 18) is most influenced by the flare when there is a phase difference of π/2 between the flare and the light to be detected. The phase error due to the flare under this condition can be expressed by equation (3) below.

$$\varphi \cong \frac{f}{T} \quad (3)$$

Since the phase due to the flare can be regarded as being sufficiently random upon the pupil plane, the effectual value of the phase error is given by equation (4) below.

$$\varphi_{ave} \cong \frac{1}{\sqrt{2}} \frac{f}{T} \quad (4)$$

In order to cancel the influence of flare such as described above, the following procedure may be carried out. First of all, in a predetermined state (first state), an interference fringe is measured by use of the detector. The intensity I of this interference fringe as well as the phase change due to flare are such as depicted by equation (2) above. Subsequently, the diffraction grating 12 is moved in the period direction of the grating, that is, in the X-axis direction shown in FIG. 1, by an amount corresponding to a half of the grating pitch. This state will be referred to as a second state. If the diffraction grating 12 is moved by a half of the grating pitch, although the phase of the zeroth-order light 19 is unchanged, the phase of the first-order light 18 advances by π than before the grating is moved. Then, in this second state, the interference fringe is measured by use of the detector 15. The interference fringe intensity I1 obtainable therefrom as well as the phase change ø1 due to the flare, can be expressed by equation (5) below.

$$Te^{i(\theta+\pi)} + fe^{i(\theta-\alpha)} \approx Te^{i\left(\theta+\frac{f}{T}\sin\alpha_1\right)} \text{(where } f \ll T\text{)} \quad (5)$$

$$I_1 = |S|^2 + |T|^2 + 2|S||T|\cos\left(\theta + \frac{f}{T}\sin\alpha\right)$$

-continued $$\varphi_1 \approx +\frac{f}{T}\sin\alpha \, [rad.]$$

Comparing equation (1) and equation (5) each other, it is seen that the value of the phase change ø1 due to the flare has its sign inverted as compared with the value ø1 before the grating is moved. Therefore, by averaging these two wavefronts, the influence of the flare can be cancelled.

In other words, from the interference fringes obtainable in the first and second states, respectively, the respective wavefronts are retrieved in accordance with the Fourier transform method and, by subsequently averaging these two retrieved wavefronts, a wavefront with the influence of flare being cancelled can be provided. Since in the thus averaged wavefront (mean wavefront) the influence of flare has been removed or reduced significantly, the transmission wavefront of the optical system 13 to be examined can be detected very precisely and, therefore, the aberration (optical characteristics) of the optical system 13 can be measured with a highest precision.

Figure 4:
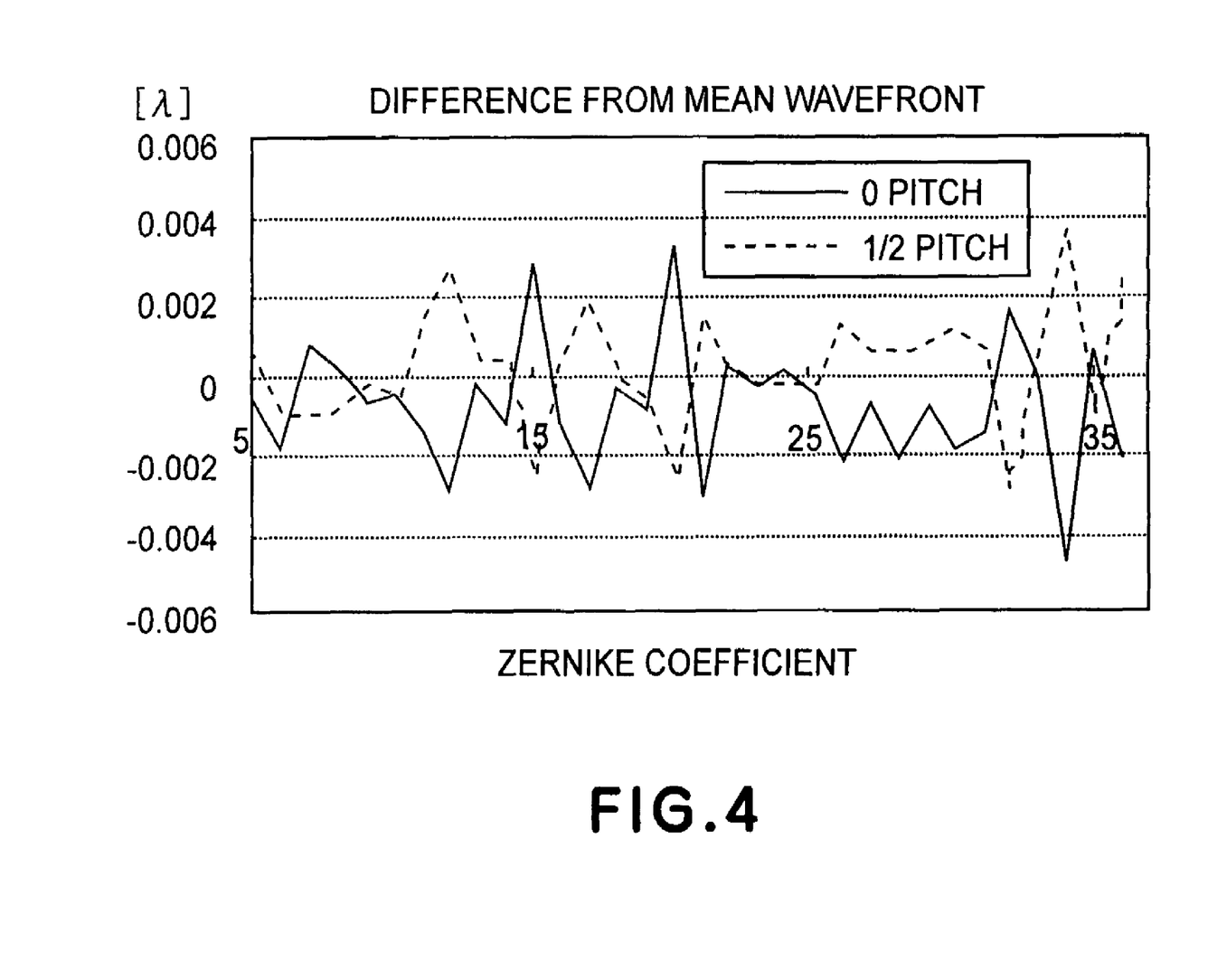
FIG. 4 is a graph for explaining the results of experiment made to inversion of the influence of a flare.

FIG. 4 shows the results of experiment in which the influence of the flare was actually inverted. In that experiment, a point diffraction interferometer was used and, while successively moving a diffraction grating by ¼ grating pitch, a sufficiently large number of interference fringes were obtained. These large number of interference fringes were retrieved in accordance with the Fourier transform method, and a large number of wavefronts were obtained. In FIG. 4, the wavefront which was obtained by averaging many wavefronts so calculated is taken as a reference, and deviations of the wavefront aberration when the grating was in its initial state (first state) as well as deviations of the wavefront aberration when the grating was moved by a half pitch (second state) both in comparison with the reference wavefront are illustrated. The axis of abscissa in FIG. 4 is taken along the fifth to thirty-sixth terms of Zernike coefficient as obtainable by effecting Zernike series expansion to the wavefront, and the respective terms represent independent components of the wavefront aberration. The axis of ordinate shows the values of coefficients, and the unit is RMS.

In FIG. 4, the solid line (zero pitch) depicts the measurement results of the wavefront aberration obtained in the first state, while the broken line (half pitch) depicts the measurement results of the wavefront aberration obtained in the second state. It is seen that, in both of them, due to the influence of flare, the aberration measurement results are deviated from the reference wavefront. However, they are approximately symmetrical with respect to the axis of abscissa. This means that, if they are averaged, then the influences of flare included there can be cancelled with each other and a measurement result which is approximately equal to the reference wavefront is obtainable.

What has been described above is the first embodiment. In this embodiment, interference fringes are observed in two different states in which the phase difference between the flare light and the light to be detected is shifted by π, and the wavefronts retrieved from these interference fringes in accordance with the Fourier transform method are then averaged. With this procedure, a wavefront with the influence of flare being cancelled or minimized is obtained.

In the first embodiment described above, interference fringes are observed in two states with the phase shifted by π, similar advantageous results are obtainable when the phase is shifted by an amount corresponding to a multiple of π as multiplied by an odd number, that is, (2n+1)π.

Furthermore, it should be especially pointed out that, in this embodiment, the advantageous feature of Fourier transform method that the measurement is not influenced by any changes in light quantity with respect to time during the observation. This is because two wavefronts are averaged after they are retrieved in accordance with the Fourier transform method such that the detection can be free from their interference fringe intensities.

Embodiment 2

A second embodiment of the present invention will now be described. While the first embodiment is based on the point diffraction interferometry, the second embodiment is based on the shearing interferometry. There are a few methods which are based on the shearing interferometry. In this embodiment, a method that uses an orthogonal diffraction grating (two-dimensional diffraction grating), that is, Cross Grating Lateral Shearing Interferometry (hereinafter, CGLSI) is practiced.

Figure 5:
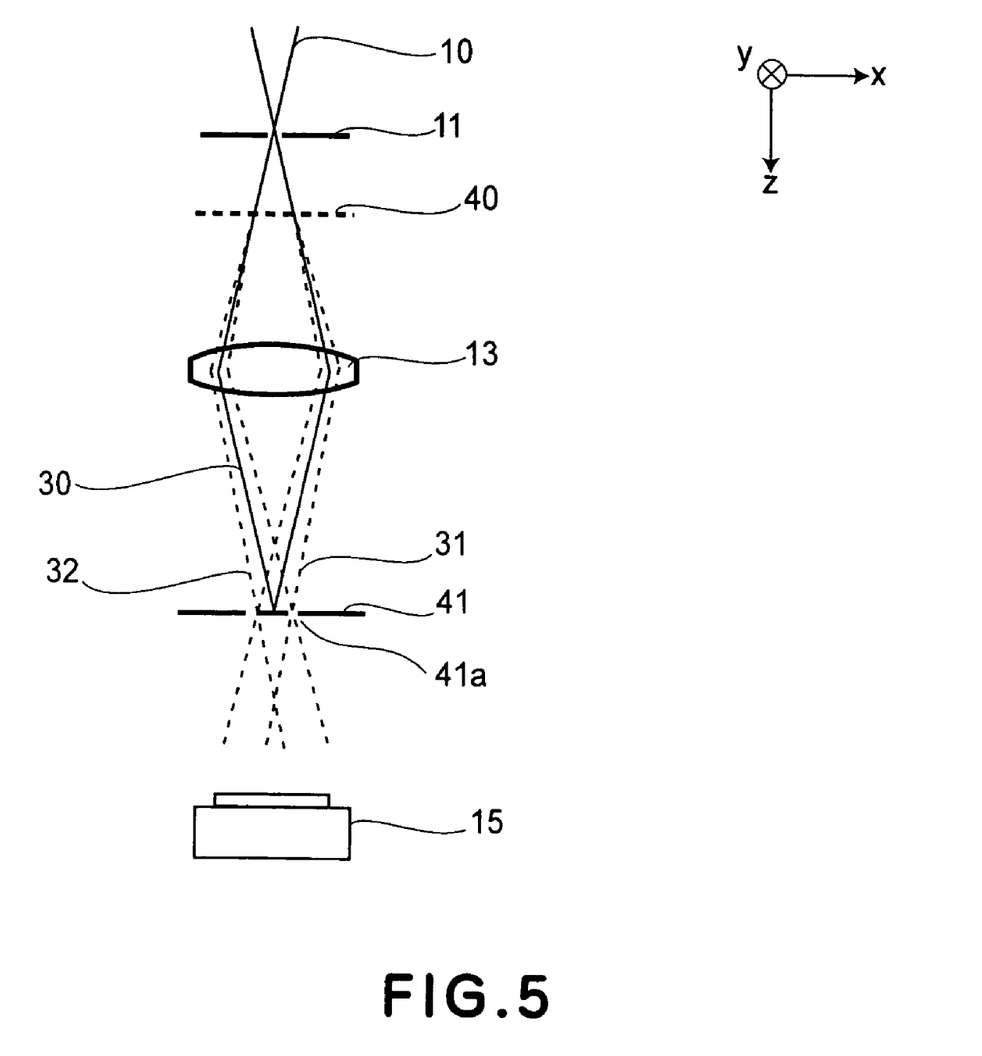
FIG. 5 is a schematic view for explaining the optical arrangement of a CGLSI (Cross Grating Lateral Shearing Interferometry).
Figure 6A:
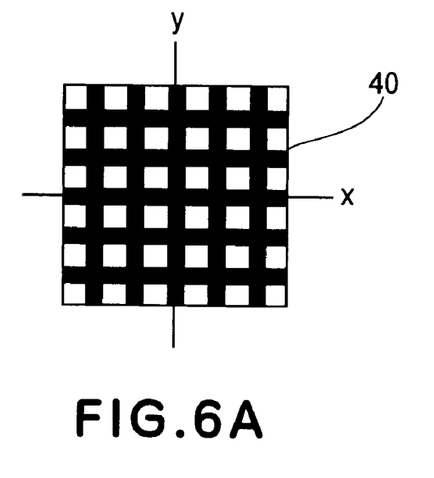
FIGS. 6A and 6B illustrate the movement direction of an orthogonal grating 42.

FIG. 5 is a schematic view of a CGLSI system. Structural portions in the drawing corresponding to those of FIG. 1 are denoted by like numerals. In FIG. 5, an idealistically spherical wave that emits out of a pinhole 11 disposed upon an object plane, is incident on a diffraction grating 40. As best seen in FIG. 6A, the diffraction grating 40 comprises a two-dimensional diffraction grating having grating elements formed along two orthogonal directions of x-axis and y-axis directions. The light incident on this diffraction grating 40 is diffracted such that, with respect to each of the X-axis and Y-axis directions, diffraction lights of predetermined orders are produced. In FIG. 5, zeroth-order light 30 as well as positive first-order diffraction light 31 (broken line) and negative first-order diffraction light 32 (broken line) with respect to the x-axis direction are illustrated. There are similar positive and negative first-order diffraction lights with respect to the y-axis direction, although they are not illustrated in FIG. 5. These diffraction lights then enters an optical system 13 to be examined.

If the optical system to be detected has an aberration, the diffraction lights passed through that optical system are imaged at respective positions on an image plane with their wavefront shapes deviated from the idealistic spherical wave in accordance with the aberration of the optical system. There is a mask 41 disposed at the image plane.

Figure 7:
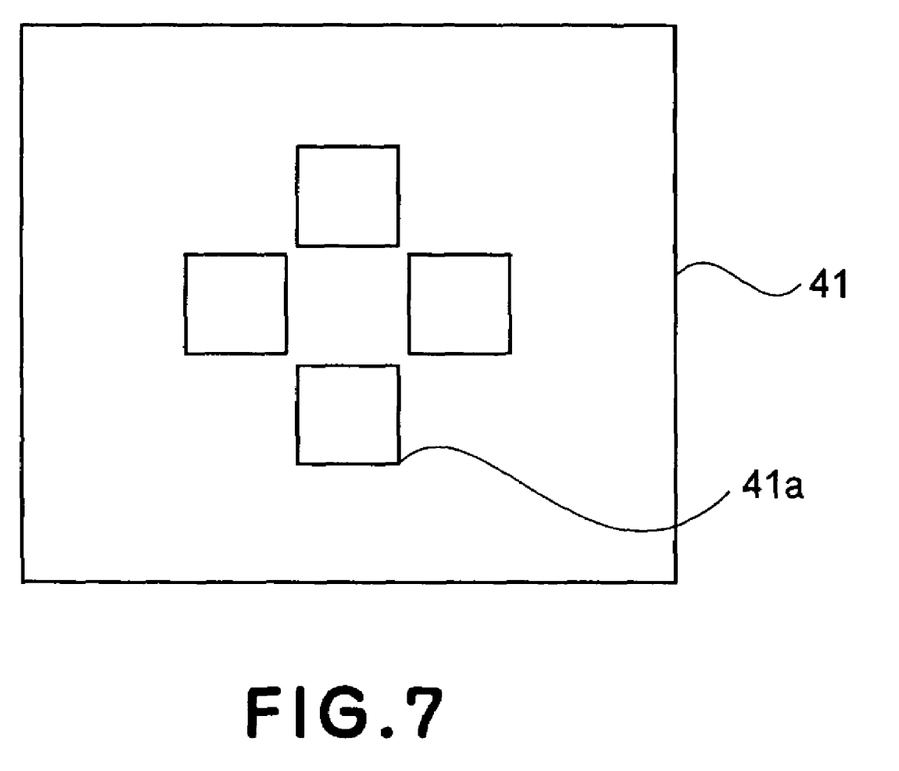
FIG. 7 is a schematic view of a mask having four windows for CGLSI.

FIG. 7 shows the structure of the mask 41. The mask 41 has four windows (openings) 41a at four locations. The four diffraction lights passed through the optical system to be examined, that is, the positive and negative first-order diffraction lights with respect to the x-axis and y-axis directions, are collected at corresponding four windows 41a, respectively. After passing through the windows, they produce an interference fringe upon the detector 15. On the other hand, zeroth-order light is collected at a region encircled by the four windows 41a, such that it is blocked by the mask 41. Thus, in the CGLSI of this embodiment, the zeroth-order light is the light which is unnecessary for the interferometric measurement.

Here, if the skirt of the intensity distribution of the zeroth-order light extends to any window 41a, for the same reason as has been described with reference to the first embodiment, such portion of the zeroth-order light acts as flare and it adversely influences the interference fringe.

In the CGLSI of this embodiment, four diffraction lights, that is, positive and negative first-order diffraction light with respect to the x-axis and y-axis directions, are caused to interfere with each other. Therefore, upon the detector 15, a grid-like interference fringe is measured. In the CGLSI, an interference fringe corresponding to a differential wavefront obtainable by laterally shifting (shearing) the transmission wavefront of the optical system to be examined, can be observed. In this context, the differential wavefront that can be retrieved from interference fringe information having been sheared in x direction will be referred to as "X-sheared wavefront", and the differential wavefront that can be retrieved from interference fringe information having been sheared in y direction will be referred to as "Y-sheared wavefront". Here, the X-sheared wavefront and the Y-sheared wavefront are detected independently of each other from longitudinal fringes and lateral fringes of the grid-like interference fringe, respectively. This means that, in regard to the influence of flare as well, they can be considered independently of each other.

The CGLSI of this embodiment differs from the point diffraction interferometry (PDI) of the first embodiment, in two points. That is, (1) positive and negative first-order diffraction lights are caused to interfere with each other, and (2) an orthogonal grating is used. For the reason (1) above, upon the light receiving surface of the detector 15, each of the positive and negative first-order diffraction lights contains an influence of flare. Where the phase of the positive first-order light is denoted by θp and the phase of the negative first-order light is denoted by θm, during the shearing it is necessary to detect the shearing phase θp-θm. A complex amplitude at a certain position on the light receiving surface of the CGLSI is expressed by equation (6) and, here, the interference fringe intensity I2 and the phase change ø2 due to the flare are given by equation (7).

$$Te^{i\theta p} + fe^{i(\theta p - \alpha p)} + Te^{i\theta m} + fe^{i(\theta m - \alpha m)} \approx \qquad (6)$$

$$Te^{i\left(\theta p - \frac{f}{T}\sin\alpha p\right)} + Te^{i\left(\theta m - \frac{f}{T}\sin\alpha m\right)}$$

where $f \ll T$.

$$I_2 = \left| Te^{i\left(\theta p - \frac{f}{T}\sin\alpha p\right)} + Te^{i\left(\theta m - \frac{f}{T}\sin\alpha m\right)} \right|^2 \qquad (7)$$

$$= 2|T|^2 + 2|T|^2 \cos\left(\theta p - \theta m - \frac{f}{T}\sin\alpha p + \frac{f}{T}\sin\alpha m\right)$$

$$\therefore \varphi_2 = -\frac{f}{T}(\sin\alpha p - \sin\alpha m)[rad.]$$

In these equations, αp corresponds to the difference between the phase θp of the positive first-order light and the phase of the flare of the zeroth-order light which extends to the light convergence point of the positive-first order light. Also, in these equations, αm denotes the difference between the phase θm of the positive first-order light and the phase of the flare of the zeroth-order light which extends to the light convergence point of the negative first-order light. Paying a particular attention to the influence ø2 of the flare in these equations, it is seen that, like the first embodiment, by wavefront retrieving the two interference fringes obtained with respect to different grating positions shifted by a half pitch in accordance with the Fourier transform method and by subsequently averaging them, a wavefront with the influence of flare has been cancelled is detectable.

Therefore, in this embodiment, two interference fringes are acquired in the states in which the position of the orthogonal grating is shifted in x-axis direction by a half pitch, and then wavefront retrieval is carried out to them in accordance with the Fourier transform method. Finally, the retrieved wavefronts are averaged. With this procedure, an X-sheared wavefront in which the influence of flare has been cancelled is detectable. Similarly, two interference fringes are acquired in the states in which the position of the orthogonal grating is shifted in y-axis direction by a half pitch, and then wavefront retrieval is carried out to them in accordance with the Fourier transform method. Finally, the retrieved wavefronts are averaged. With this procedure, a Y-sheared wavefront is detectable while canceling the influence of flare.

Figure 6B:
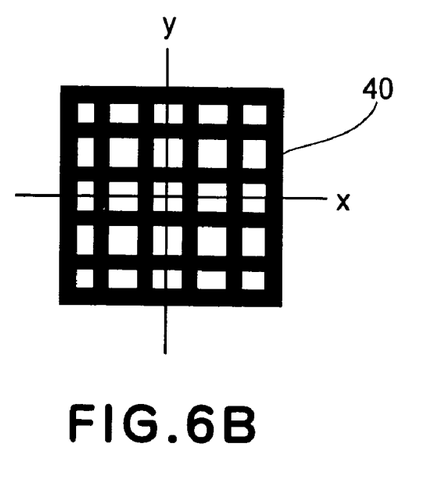

On the other hand, in the CGLSI, if the orthogonal grating is moved in x-axis or y-axis direction, it causes only one-dimensional grating displacement of the two-dimensional grating. If therefore the grating movement direction is shifted in x-axis or y-axis direction, it is necessary to move the grating at least twice to observe the interference fringe. In consideration of this, the movement direction of the grating may be taken along a direction which is tilted by 45 deg. with respect to both of the x-axis and y-axis (that is, a direction along a straight line y=±x in the x-y coordinate system). By moving the grating in this direction by a half pitch with respect to each of the x and y axes, the interference fringe observation with respect to x and y directions can be done with a single movement and, therefore, the measurement time can be shortened. FIG. 6B illustrates this. More specifically, FIG. 6B shows the state in which the grating has moved in the direction of y=x, from the state shown in FIG. 6A. The x-direction component and the y-direction component of the movement amount of the grating are a half pitch, respectively.

With the procedure described above, an X sheared wavefront and a Y sheared wavefront are obtainable while canceling the influence of flare. By effecting an integrating operation and combining operation known in the art to the thus obtained X and Y sheared wavefronts, the transmission wavefront of the optical system 13 to be examined can be measured without being influenced by the flare.

Embodiment 3

A third embodiment of the present invention will now be described. The third embodiment uses CGLSI, like the second embodiment. The procedure up to observation of interference fringes using CGLSI is the same as of the second embodiment, and duplicate explanation will be omitted here.

In the second embodiment, wavefront retrieval based on Fourier transform is carried out with respect to each of a plurality of interference fringes as observed upon the detector 15, and the thus retrieved wavefronts are averaged appropriately. In the present embodiment as compared therewith, interference fringes as observed are averaged and, after that, wavefront retrieval based on Fourier transform is carried out.

In the shearing interferometry method wherein positive and negative first-order lights are caused to interfere with each other, if the grating position is displaced by a half pitch, the phase of the positive first-order light advances by π while the phase of the negative first-order light retards by π. As a result of this, the phase of an interference fringe as obtainable through the interference of positive and negative first-order lights changes by 2π. For this reason, even if the grating is moved by a half pitch, the interference fringe position on the light receiving surface of the detector 15 is unchanged between before the movement and after the movement. As regards the influence of flare, on the other hand, it is inverted between before the movement and after the movement of the grating, as described with reference to the second embodiment.

This means that, in two interference fringes obtainable before and after the grating movement, respectively, the influence of flare is inverted although the fringe position is unchanged. Therefore, by averaging two interference fringe images, an interference fringe in which the influence of flare has been cancelled can be provided while preserving aberration information on the optical system to be examined, in the light to be detected.

Equation (8) below concerns the interference fringe intensity I3 at a certain position on the light receiving surface of the detector, as well as the erroneous detection amount ø3 due to the flare.

$$I_3 = 2T^2 + 2T^2 \cos\left(\theta p - \theta m + \frac{f}{T}\sin\alpha p - \frac{f}{T}\sin\alpha m\right) \quad (8)$$

$$\therefore \varphi_3 = +\frac{f}{T}\left(\sin\alpha p - \frac{f}{T}\sin\alpha m\right)[rad.]$$

When the interference fringe intensities by equations (7) and (8) are averaged, equation (9) below is obtainable.

$$I_2 + I_3 = 2T^2 + 2T^2\cos(\theta p - \theta m)\cos\left\{\frac{2f}{T}(\sin\alpha p - \sin\alpha m)\right\} \approx \quad (9)$$

$$2|T|^2 + 2|T|^2\cos(\theta p - \theta m)(\because f \ll T)$$

It is seen from the above that upon the detection surface an interference fringe that corresponds to a sheared wavefront θp-θm with the influence of flare being removed, is detectable. By effecting wavefront retrieval based on the Fourier transform method to the thus detected interference fringe, a sheared wavefront with the influence of flare being removed is obtainable.

As compared with a method in which plural interference fringes are first wavefront retrieved, respectively, by using a Fourier transform method and in which they are subsequently averaged, the procedure described above is advantageous in respect to reduction in measurement time since the number of wavefront retrievals can be reduced. Furthermore, since the number of Fourier transforming operations and associated computing operations can be smaller, there is an additional advantage that errors related to calculation can be reduced.

Embodiment of Exposure Apparatus

Next, an embodiment of exposure apparatus having an interference measuring system according to any one of the first to third embodiments described above, will be explained.

The first to third embodiments have been described with reference to an interference measuring method and an interference measuring apparatus for measuring a wavefront transmitted through an optical system to be examined, while canceling any influences of a flare. Since such an interference measuring apparatus is capable of measuring a transmission wavefront of an optical system very precisely, it is very suitable for measurement of optical characteristics of an optical system of an exposure apparatus wherein extraordinarily high precision aberration control is required.

Particularly, the wavelength of a light source of exposure apparatuses is becoming shorter and shorter, and thus the amount of wavefront aberration acceptable for an optical system is also becoming smaller and smaller. As an-example, the acceptable wavefront aberration for a projection optical system in an EUV exposure apparatus using EUV (Extreme Ultraviolet) light having a light source wavelength of about 13.5 nm is about 0.4 nm (RMS).

The influence of flare in a case where such projection optical system is measured by means of a point diffraction interferometer using a wavelength λ=13.5 nm, will now be explained with reference to specific numerical values. In an example wherein the intensity of a flare to be produced by extension of zeroth-order light is 0.04% of that of the zeroth-order light and wherein the intensity of first-order light is 8.2% of that of the zeroth-order light, if these values are substituted into equation (4) of the first embodiment and what is obtained is then multiplied by λ/2π and is converted into a length scale, the calculation result is øave=0.1 nm (RMS). This means that there is an influence of flare of about 0.1 nm (RMS). This amount can not be disregarded in the measurement of wavefront aberration of an amount of about 0.4 nm (RMS).

If an interferometer according to any one of the preceding embodiments is introduced into a major assembly of an exposure apparatus, it enables measurement of optical characteristics of an optical system during maintenance or the like of the exposure apparatus. This is an advantage. Now, an embodiment wherein an interferometer according to any one of the preceding embodiments is incorporated into a major assembly of an exposure apparatus, will be described.

If an interference measuring apparatus of the present invention is incorporated into a projection exposure apparatus arranged to transfer, by exposure, a pattern of a reticle (mask) onto a wafer being coated with a resist, through a projection optical system, then the optical characteristic (wavefront aberration) of the projection optical system can be measured very precisely, at the major assembly of the exposure apparatus.

Figure 8:
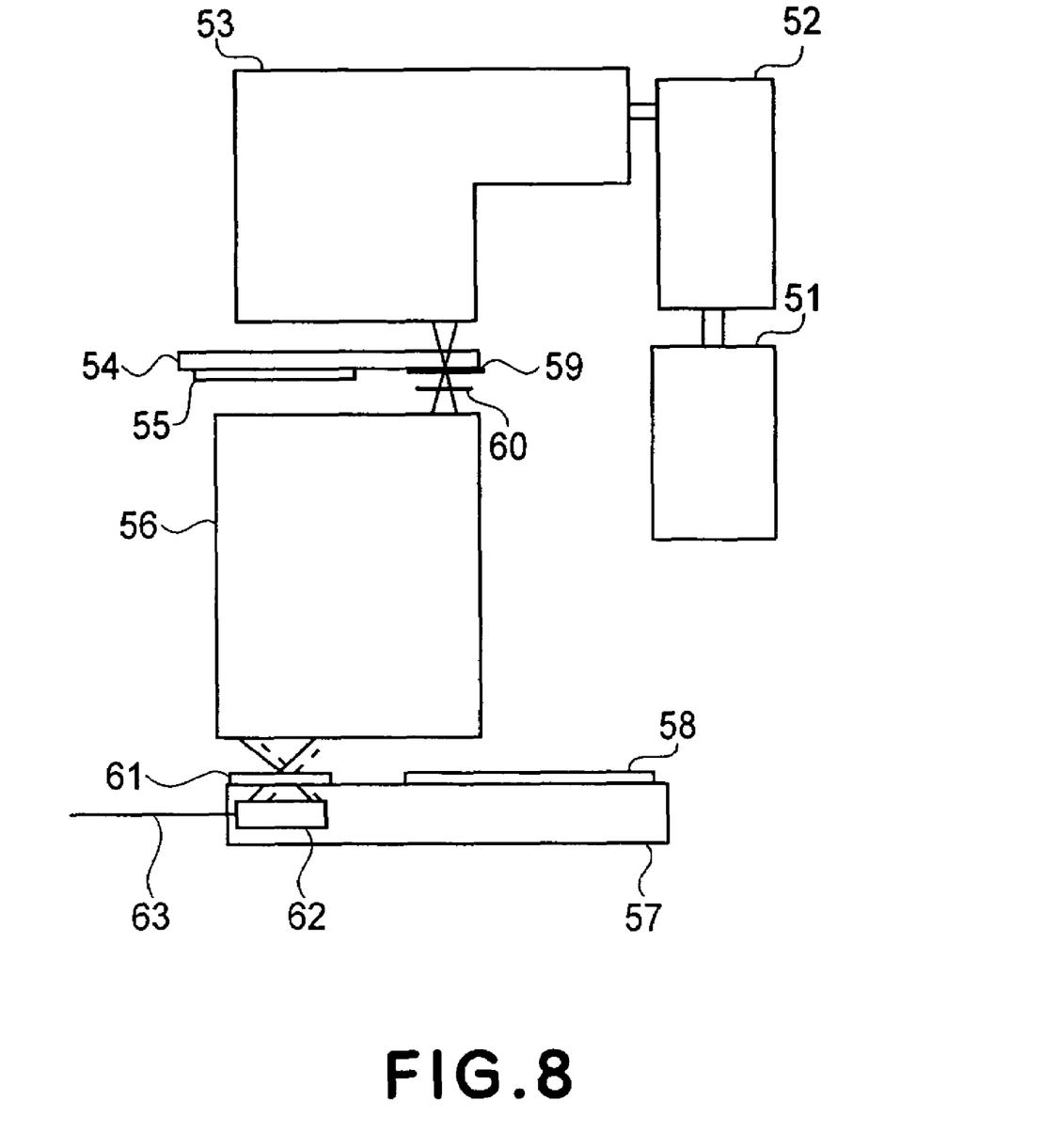
FIG. 8 is a schematic view of an exposure apparatus having an interferometer.

FIG. 8 is a schematic view of a projection exposure apparatus of this embodiment. Denoted in FIG. 8 at 51 is an exposure light source such as an excimer laser, for example. Denoted at 52 is a light directing optical system, and denoted at 53 is an illumination optical system. Denoted at 54 is a reticle stage, and denoted at 55 is a reticle. Denoted at 56 is a projection optical system, and denoted at 57 is a wafer stage. Denoted at 58 is a wafer. For an exposure process, exposure light emitted from the exposure light source goes via the directing optical system 52 and the illumination optical system 53, and it illuminates the reticle 55 placed on the reticle stage 54. A circuit pattern of the reticle as illuminated by the exposure light is imaged by the projection optical system 56 upon the surface of a wafer which is mounted on the wafer stage 57. By this, the pattern of the reticle is transferred onto the wafer.

Now, measurement of optical characteristics (wavefront aberration) of the projection optical system 56 using an interference measuring apparatus according to this embodiment of the present invention will be described. In this embodiment, the exposure light source is used also as the light source for the interference measurement, and the illumination optical system 53 of the exposure apparatus is used also as the illumination optical system for the interference measurement. Denoted at 59 is an object-side mask having a pinhole formed therein. This mask is held by the reticle stage 54. Denoted at 60 is a diffraction grating which serves as light dividing means. It is held at a predetermined position by means of a holding member, not shown. Denoted at 61 is an image-side mask held by the wafer stage, and it has a slit and a window formed therein. Denoted at 62 is a CCD.

Light from the exposure light source 51 illuminates the object-side mask 59, and an idealistically spherical wave is projected from the object-side mask 59. The projected spherical wave is then divided by the diffraction grating 60, and zeroth-order light passes through the projection optical system 56 and is collected thereby at the slit of the image-side mask 61 while first-order light is collected at the window of the image-side mask 61. These lights are a reference light and a light to be detected, respectively, and they produce an interference fringe upon the CCD 62. The data obtained at the CCD 62 is sent to a computing device, not shown, through communication means 63. By means of this computing device, the optical characteristic of the projection optical system 56 can be calculated on the basis of the interference fringe.

In accordance with this embodiment of the present invention, the optical characteristic of the projection optical system 56 can be measured very precisely by use of the interference measuring apparatus. Therefore, the aberration of the projection optical system 56 can be reduced sufficiently and, as a result of it, the pattern of the reticle can be transferred to the wafer vary accurately.

Although in this embodiment the exposure light source is used also as a light source for the interferometric measurement, a separate light source such as a light source for alignment operation, for example, may be used as the light source for the interference measurement.

Furthermore, while in this embodiment an excimer laser is used as the exposure light source, the exposure light source is not restricted to it. For example, the present invention is applicable to an exposure apparatus in which EUV light is used as an exposure light source. Where EUV light is used, the optical system may comprise all reflection optical elements such as mirrors, for example, rather than refractive optical elements such as lenses.

Next, an embodiment of a device manufacturing method which uses an exposure apparatus having an interference measuring apparatus according to any one of the preceding embodiments of the present invention described above, will be explained.

Figure 9:
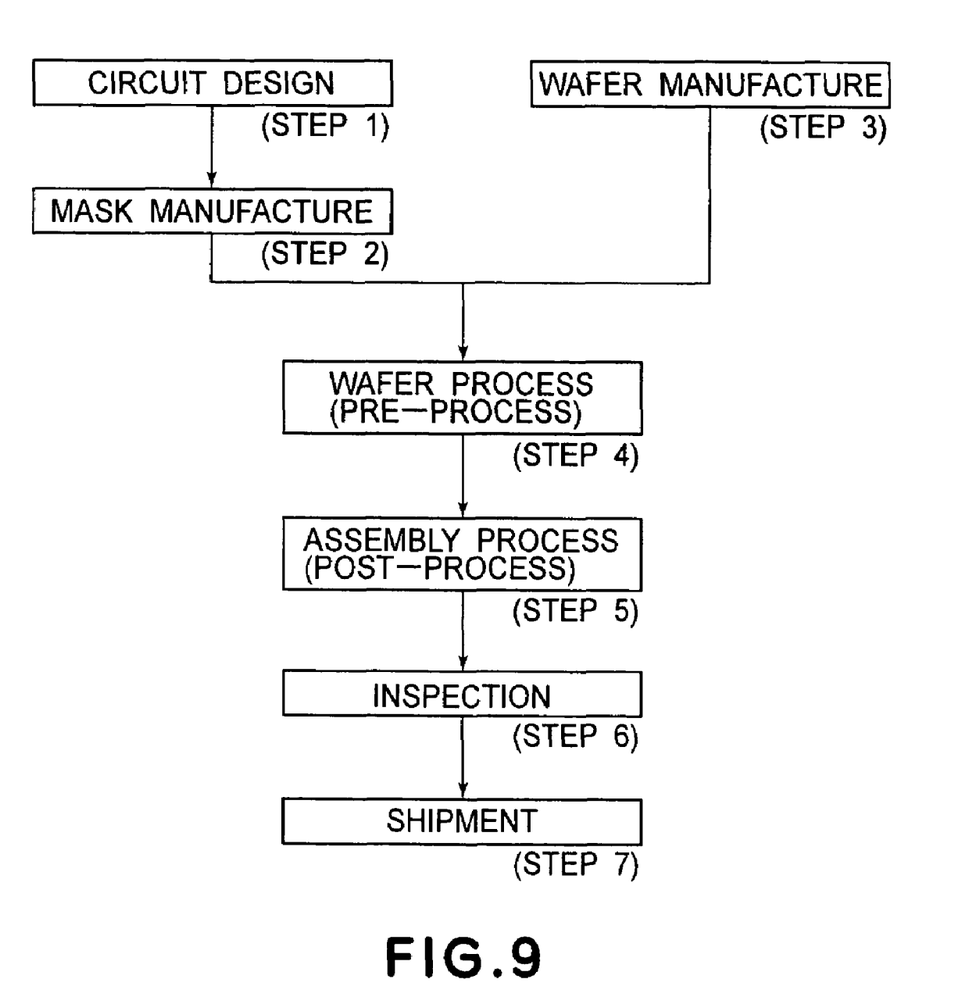
FIG. 9 is a flow chart for explaining device manufacturing processes which use the exposure apparatus shown in FIG. 8.

FIG. 9 is a flow chart for explaining the procedure of manufacturing various microdevices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 10:
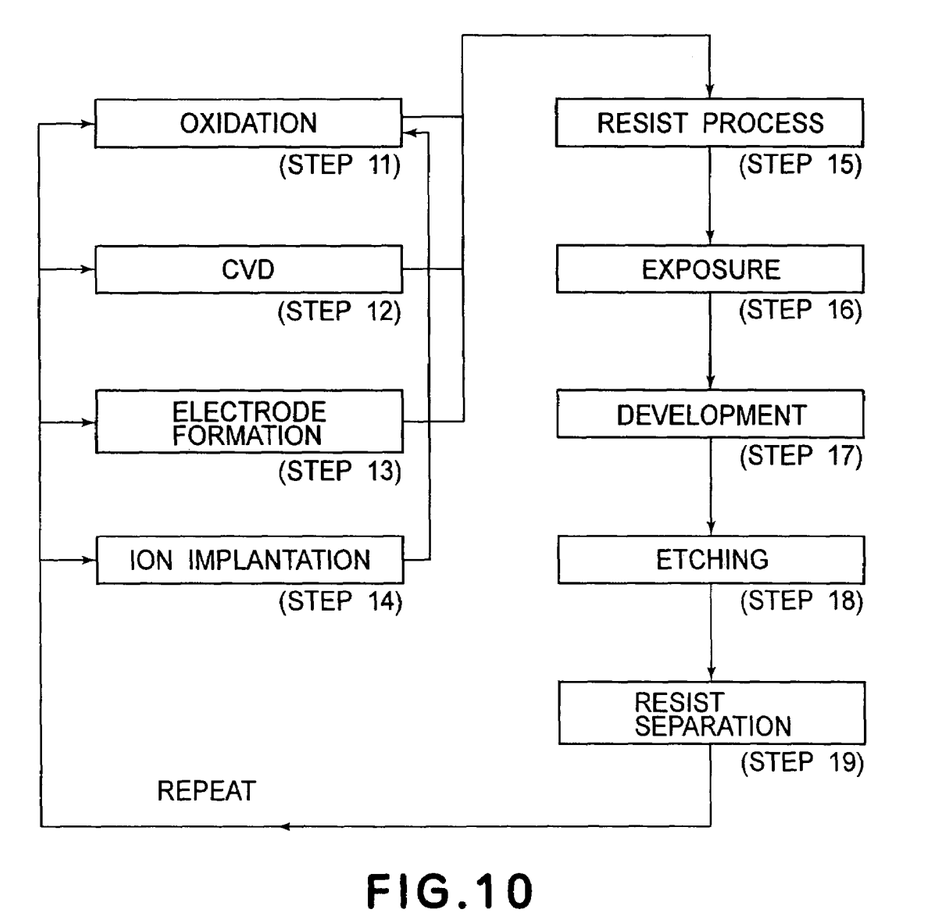
FIG. 10 is a flow chart for explaining details of a wafer process at Step 4 in the flow chart of FIG. 9.

FIG. 10 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer. With these processes, high density microdevices can be manufactured.

In accordance with the device manufacturing method of this embodiment, the imaging performance of the projection optical system 56 can be detected quickly and easily. Therefore, a decrease of exposure throughput can be avoided. Also, it enables use of a projection optical system 56 with its aberration corrected very precisely. As a result, high resolution devices (semiconductor devices, LCD devices, image-pickup devices such as CCD, for example) which are conventionally difficult to manufacture, can be produced with lower cost and higher productivity. The projection optical system having its wavefront aberration corrected as such functions also to perform high precision alignment of the wafer stage.

It should be noted that a device manufacturing method that uses an exposure apparatus as well as a device as a product thereof (intermediate product and final product) are also included within the scope of the present invention.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2005-053445 filed Feb. 28, 2005, for which is hereby incorporated by reference.

What is claimed is:

1. A method of analyzing an interference fringe produced by interference of light, said method comprising:
   a first detecting step for detecting information related to a first interference fringe produced by interference of two light fluxes;
   a second detecting step for detecting information related to a second interference fringe produced while changing a phase of one of the two light fluxes by $(2n+1)\pi$, where n is an integer; and
   calculating step for calculating averaged information of each phase information of the first and second interference fringes, on the basis of the detected information of the first and second interference fringes and by use of Fourier transform.

2. A method according to claim 1, wherein the two light fluxes are diffraction lights having different diffraction orders, mutually divided by use of a diffraction grating, and wherein the information related to the second interference fringe is detected while shifting the diffraction grating by a half pitch in a period direction of its grating as compared with said first detecting step for detecting the information related to the first interference fringe.

3. A method according to claim 1, wherein said third step for detecting the averaged information includes (i) a process for detecting phase information of the first interference fringe, from the information of the first interference fringe and by use of Fourier transform, (ii) a process for detecting phase information of the second interference fringe, from the information of the second interference fringe and by use of Fourier transform, and (iii) a process for averaging the detected two pieces of phase information.

4. A method according to claim 1, wherein said third step for detecting the averaged information includes (i) a process for averaging the information of the first and second interference fringes, and (ii) a process for detecting phase information of the averaged interference fringes, from the averaged information of the interference fringes and by use of Fourier transform.

5. A method according to claim 1, wherein the first and second interference fringes are produced on the basis of a point diffraction interferometry.

6. A method according to claim 1, wherein the first and second interference fringes are produced on the basis of a shearing interferometry.

7. A method according to claim 6, wherein the shearing interference is a two-dimensional shearing interferometry using an orthogonal diffraction grating having a periodicity in two orthogonal directions.

8. A method according to claim 7, wherein the information of the second interference fringe is detected while shifting the orthogonal diffraction grating by a half pitch with respect to each of the two periodicity directions.

9. An analyzer for analyzing an interference fringe, comprising:

interference fringe measuring unit for detecting information related to a first interference fringe produced by interference of two light fluxes, and information of a second interference fringe produced while shifting a phase of one of the two light fluxes by $(2n+1)\pi$, where n is an integer; and calculating unit for calculating averaged information of each phase information of the first and second interference fringes, on the basis of the information of the first and second interference fringes detected through said interference fringe measuring means and by use of Fourier transform.

10. An exposure apparatus, comprising:

an optical system; and an analyzer as recited in claim 9, for analyzing an interference fringe produced with light passed through said optical system, to detect information related to wavefront aberration of said optical system.

11. A device manufacturing method, comprising the steps of:

exposing a wafer by use of an exposure apparatus as recited in claim 10; and developing the exposed wafer.

* * * * *